(12) United States Patent
Ramakrishna et al.

(10) Patent No.: US 7,790,504 B2
(45) Date of Patent: Sep. 7, 2010

(54) INTEGRATED CIRCUIT PACKAGE SYSTEM

(75) Inventors: Kambhampati Ramakrishna, Chandler, AZ (US); Byung Joon Han, Singapore (SG); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 371 days.

(21) Appl. No.: 11/276,727

(22) Filed: Mar. 10, 2006

(65) Prior Publication Data
US 2007/0210425 A1 Sep. 13, 2007

(51) Int. Cl.
H01L 21/00 (2006.01)
(52) U.S. Cl. .................. 438/109; 438/106; 438/107; 257/733; 257/686; 257/678
(58) Field of Classification Search ............ 257/678, 257/666, 723, 777; 438/613–620
See application file for complete search history.

(56) References Cited

U.S. PATENT DOCUMENTS

| | | | |
|---|---|---|---|
| 5,742,100 A * | 4/1998 | Schroeder et al. ........... 257/778 |
| 6,815,252 B2 | 11/2004 | Pendse | |
| 6,828,220 B2 | 12/2004 | Pendse et al. | |
| 2002/0060366 A1 * | 5/2002 | Kikuchi et al. ............. 257/776 |
| 2002/0093108 A1 * | 7/2002 | Grigorov .................... 257/781 |
| 2002/0149091 A1 * | 10/2002 | Palmteer et al. ............ 257/667 |
| 2004/0262774 A1 * | 12/2004 | Kang et al. ................. 257/777 |
| 2005/0095835 A1 * | 5/2005 | Humpston et al. .......... 438/613 |
| 2005/0151273 A1 * | 7/2005 | Arnold et al. .............. 257/788 |
| 2005/0167812 A1 * | 8/2005 | Yoshida et al. ............. 257/686 |
| 2006/0186514 A1 * | 8/2006 | Shim et al. ................. 257/666 |
| 2006/0220206 A1 * | 10/2006 | Gerber et al. .............. 257/686 |
| 2007/0001296 A1 * | 1/2007 | Lee et al. ................... 257/723 |
| 2007/0148822 A1 * | 6/2007 | Haba et al. ................. 438/110 |

* cited by examiner

Primary Examiner—Mary Wilczewski
Assistant Examiner—Telly D Green
(74) Attorney, Agent, or Firm—Mikio Ishimaru

(57) ABSTRACT

An integrated circuit package system is provided providing a first structure, forming a compression via in the first structure, forming a stud bump on a second structure and pressing the stud bump into the compression via forming a mechanical bond.

20 Claims, 8 Drawing Sheets

INTEGRATED CIRCUIT PACKAGE SYSTEM

TECHNICAL FIELD

The present invention relates generally to integrated circuit package systems, and more particularly to a system for flip-chip integrated circuit packages.

BACKGROUND ART

Semiconductor chips, commonly referred to as "integrated circuits" are an essential component of electronic devices, such as cell phones, personal computers and personal entertainment devices. These chips are usually mounted on a platform which is also equipped with terminals for the electrical connectivity with the external world. The platform could be either a single layer metal leadframe or a multi-layer printed wire board or a structure of similar function. Besides providing means for external electrical connectivity, these platforms also provide mechanical support to the chips. Encapsulation ensures protection of the chip from harsh physical and environmental factors. The interconnection between the chip and its supporting platform is commonly referred to as "first level" assembly. Several approaches exist for the first level assembly of chip to a supporting platform. These include so called "Wire-bonding", "Tape Automated Bonding (TAB)" and "Flipchip" approaches.

The approach for the first level connection between the chip and the platform has strong ramifications on the overall package size, performance and reliability. In an electronic device circuit, several packages are interconnected using a common printed circuit board. A large package size increases the distance between chips or between each chip and other elements of the circuit. These larger distances result in longer delays in the transmission of electrical signals between chips. Consequently, the entire electronic device is slowed down.

The approach used for the first level assembly of the chip to the platform also influences the capacitances and inductances associated with the chip-to-platform connections. Interconnections which result in large values of capacitances and inductances may result in large signal transmission delays, large switching noise and therefore performance degradation. Thus, lowering the capacitive and inductive parasitics associated with first level assembly is highly desirable.

Wire-bonding ordinarily can only be employed when the chip I/O pads are distributed along the periphery of the chip and the substrate connection pads surround the chip in a ring-like configuration. For circuits which involve simultaneous switching of a large number of gates, as is the case in present generation of microprocessors, high inductances of the wire bonds lead to a large switching noise. Wire bonds usually fan out from the chip to the platform. Therefore, overall package size increases considerably relative to the chip size. Therefore, from the electrical noise and compactness standpoint, wire-bonding does not provide an optimal first level assembly process.

Tape automated bonding (TAB) requires a flexible tape with metal leads mounted on a polymer film. Usually, the tape leads fan out from the chip pads to the platform connection pads. Therefore, the package is considerably larger than the chip. The flexible tape represents a new layer for interconnection and considerably adds to the cost of the package. This is an additional process step and requires processes similar to those used for IC fabrication such as lithography and etching. The chips are bonded to a flexible tape which contains metal traces for external connectivity. Usually all the leads are bonded simultaneously to the chip pads in what is referred as "Gang Bonding" process. This requires very tight control of the planarity of the tape leads and the chip pads connection sites. From a mechanical stress standpoint, flexible tape represents a good solution because the tape can deform and absorb the stress thereby increasing the reliability of the joints.

In a flipchip process, usually the I/O pads are distributed on the entire surface of the chip. This enables placement of a larger number of I/O pads at an increased pitch without increasing the size of the silicon chip. The I/O pads are deposited with metal bumps of materials which can melt at bonding temperatures and fuse with the substrate pad materials. The chip is bonded face-down such that the active face of the chip with the connection pads faces the top surface of the substrate. The metal bumps on the chip pads provide a separation between the chip and the substrate. Therefore, inductances associated with these bumps are considerably lower than a wire-bond or a TAB lead. An epoxy resin material is dispensed in the region between the chip and the substrate. This so called "underfill" material encapsulates the exposed regions of the metallic joints and acts as a stress buffer thereby significantly improving the reliability. However, this underfilling step is an additional process and adds to the assembly cost by increasing the process cycle time as well as the number of constituent layers.

Thus, a need still remains for an economical and reliable assembly process that allows small package size and the possibility of multiple packages in a single package. In view of the rigorous economic demands and system performance requirements, it is increasingly critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including providing a first structure, forming a compression via on the first structure, forming a stud bump on an second structure and pressing the stud bump into the compression via forming a mechanical bond.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
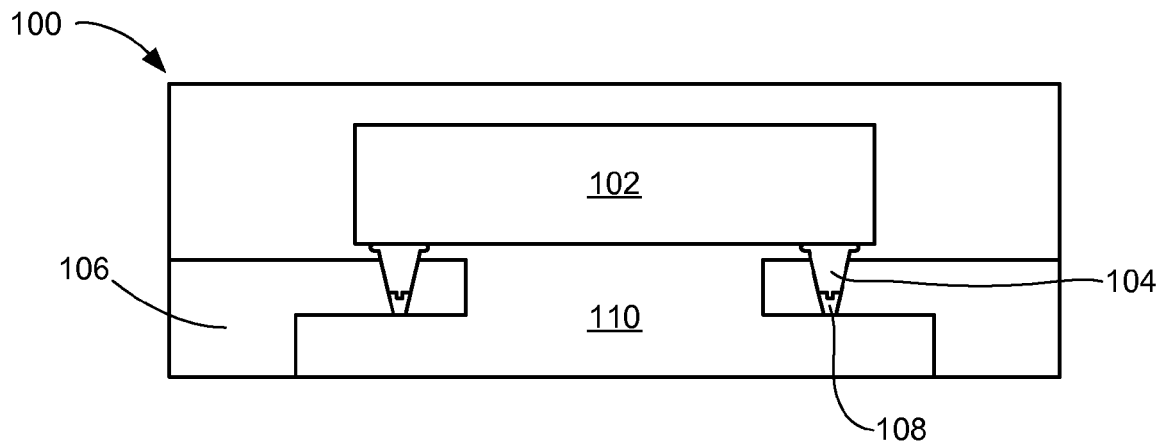
FIG. 1 is a cross-sectional view of an integrated circuit package system, in an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the drawing FIG's. Where multiple embodiments are disclosed and described as having some features in common, for clarity and ease of illustration, the description, and comprehension thereof, similar and like features one to another will ordinarily be described with like reference numerals.

The term "horizontal" as used herein is defined as a plane parallel to the conventional plane or surface of the integrated circuit die regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100, in an embodiment of the present invention. The cross-sectional view of the integrated circuit package system 100 includes a second structure 102, such as an integrated circuit die, having a stud bump 104. The stud bump 104 may be a wire based stud bump of gold. The cross-sectional view also includes a first structure 106, such a leadframe lead having half etched inner leads or a tape substrate, and a compression via 108. The compression via 108 may be in the shape of a cone, a cylinder, a rectangle, a hexagon or a similar geometric shape. The compression via 108 may have sloped side walls or vertical side walls. The second structure 102 and the first structure 106 are encapsulated by a molding compound 110.

The second structure 102 is aligned so that the stud bump 104 is aligned over the compression via 108 in the first structure 106. A support block (not shown) is used to support the first structure 106 during the insertion process. The second structure 102 is forced down, such that the stud bump 104 is at least partially inserted into the compression via 108 and the stud bump 104 deforms slightly, to create an interference fit with the top of the compression via 108. The interference fit forms a mechanical bond between the stud bump 104 and the first structure 106. This mechanism establishes a very short electrical connection that has low inductance.

Figure 2:
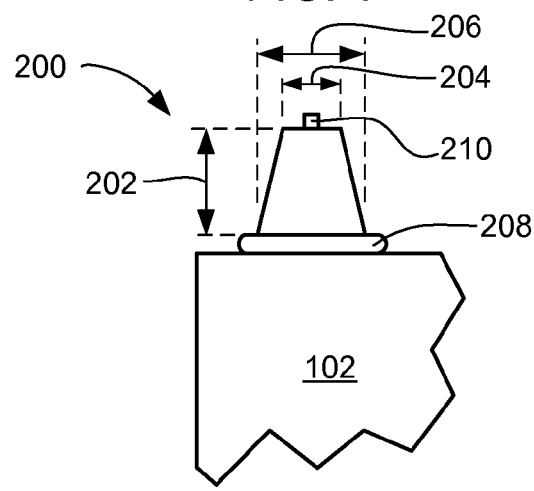
FIG. 2 is a cross-sectional view of a stud bump, in an embodiment of the present invention.

Referring now to FIG. 2, therein is shown a cross-sectional view of a stud bump 200, in an embodiment of the present invention. The cross-sectional view of the stud bump 200 depicts the relative dimensions of the bump. A bump height 202 determines the ease of alignment, but must be balanced with the depth of the via into which it extends. A narrow diameter 204 is smaller than the widest opening of the via into which it extends, while a wide diameter 206 is larger than the widest opening of the via. The cross-sectional view depicts the stud bump 200 as a trapezoidal shape with a base flange 208 and a wire tail 210. The trapezoidal shape is achieved by using a bottleneck capillary (not shown). The base flange 208 is used to attach the stud bump 200 to the second structure 102 (shown in section). The wire tail 210 is an artifact of the construction of the stud bump 200 and is optional.

Figure 3:
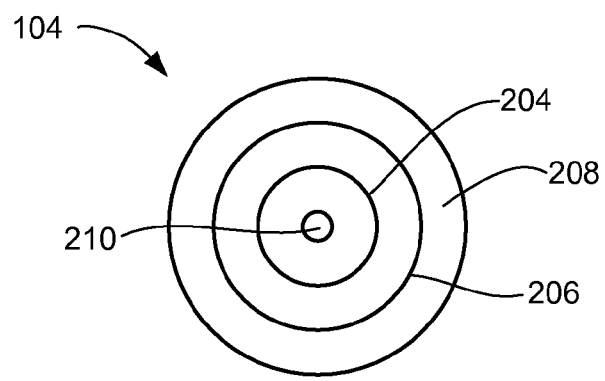
FIG. 3 is a top view of the stud bump of FIG. 2.

Referring now to FIG. 3, therein is shown a top view of the stud bump 200, of FIG. 2. The top view of the stud bump 200 depicts a series of concentric circles representing the base flange 208, the wide diameter 206, the narrow diameter 204 and the wire tail 210. The conical shape of the stud bump 200 is one of the possible embodiments.

Figure 4:
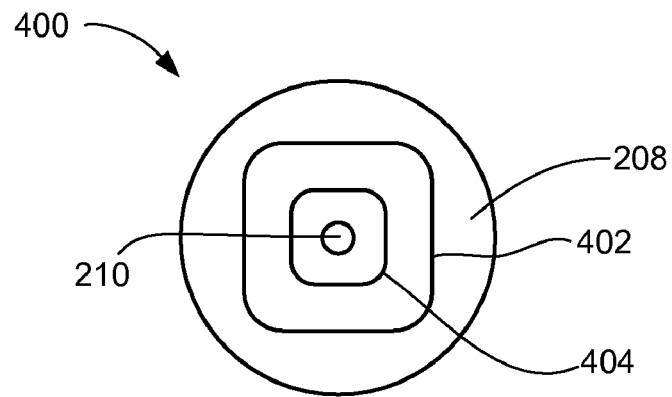
FIG. 4 is a top view of a stud bump in an alternative embodiment of the stud bump of FIG. 1.

Referring now to FIG. 4, therein is shown a top view of a stud bump 400 in an alternative embodiment of the stud bump 200, of FIG. 2. The top view of the alternative embodiment of the stud bump 400 depicts the base flange 208, a wide rectangle 402, such as a square shape, an narrow rectangle 404 and the wire tail 210. The wide rectangle 402 and the narrow rectangle 404 represent a trapezoidal solid (not shown).

Figure 5:
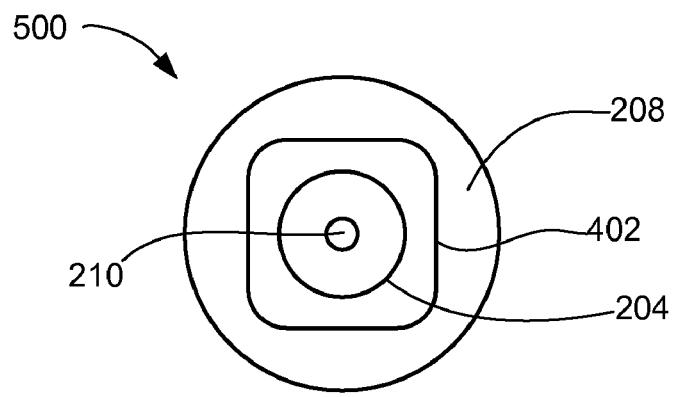
FIG. 5 is a top view of a stud bump in another alternative embodiment of the stud bump of FIG. 1.

Referring now to FIG. 5, therein is shown a top view of a stud bump 500 in another alternative embodiment of the stud bump 200, of FIG. 2. The top view of the stud bump 500 depicts the base flange 208 in combination with the wide rectangle 402, the narrow diameter 204 and the wire tail 210. The stud bump 500 has a rectangular contour that culminates in a conical top. Other geometric shapes, such as hexagons or triangles, are also possible. The resulting contour makes an interference fit when installed in the compression via 108, of FIG. 1, of the first structure 106, of FIG. 1.

Figure 6:
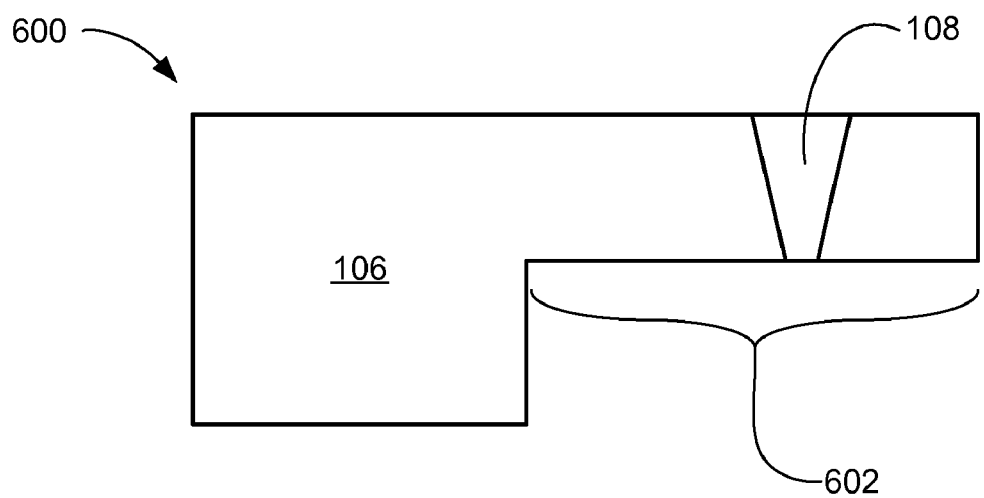
FIG. 6 is a cross-sectional view of a segment of the first structure of FIG. 1.

Referring now to FIG. 6, therein is shown a cross-sectional view of a segment 600 of the first structure 106, of FIG. 1. The cross-sectional view depicts the segment 600 of the first structure 106 having the compression via 108. The compression via 108 is etched into an inner lead 602 of the first structure 106 that has been half etched. The half etch process removes the lower section of material by etching. This allows the manufacture of the compression via 108, as a thru hole via, by an etching and plating process.

Figure 7:
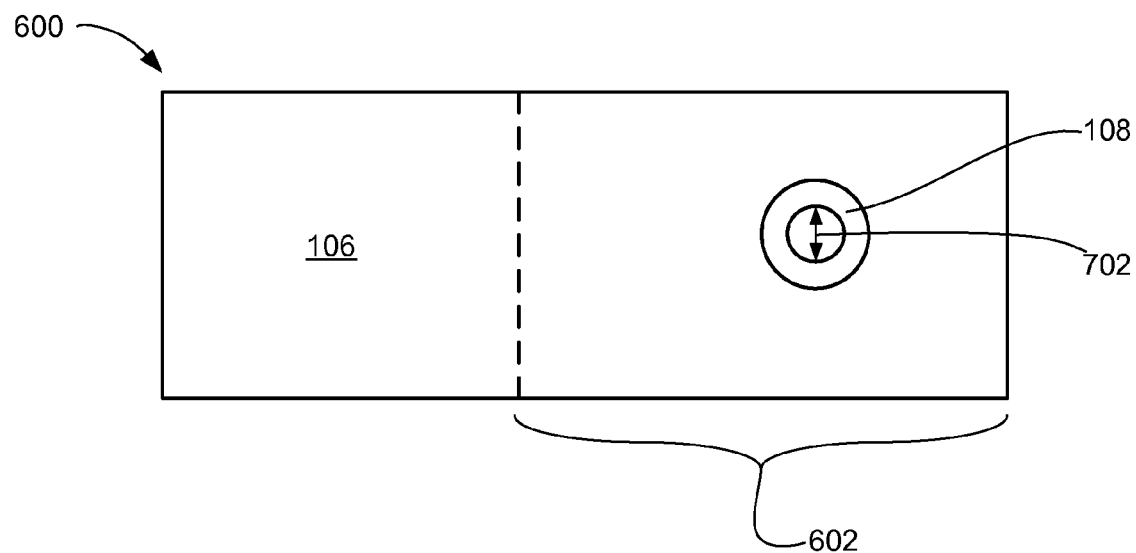
FIG. 7 is a top view of the segment of the first structure of FIG. 6.

Referring now to FIG. 7, therein is shown a top view of the segment 600 of the first structure 106, of FIG. 6. The top view depicts the segment 600 of the first structure 106 having the compression via 108. The compression via 108 is etched into the inner lead 602 of the first structure 106 that has been half etched. A sloped edge of the compression via 108 terminates at a smaller diameter 702.

Figure 8:
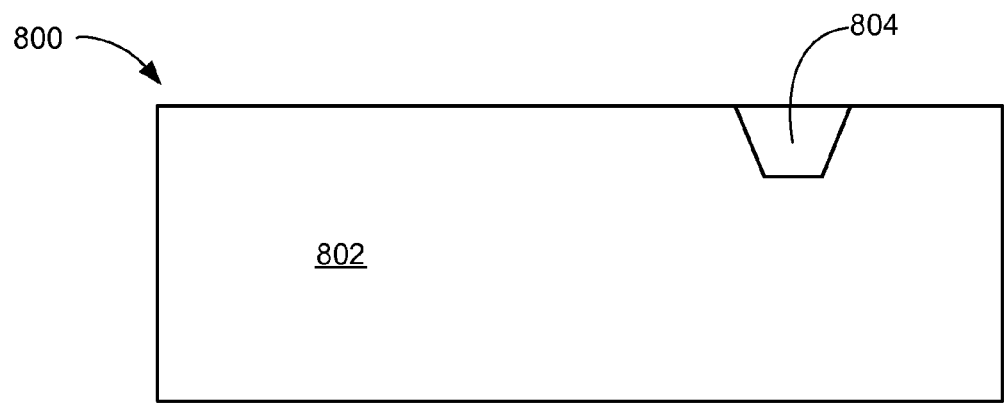
FIG. 8 is a cross-sectional view of a leadframe lead in an alternative embodiment of the first structure of FIG. 1.

Referring now to FIG. 8, therein is shown a cross-sectional view of a leadframe lead 800 in an alternative embodiment of the first structure 106, of FIG. 1. The cross-sectional view of the leadframe lead 800 depicts a lead 802 having a blind via 804. The blind via 804 would become a pressure chamber if an interference fit was made by a stud bump (not shown). In order to alleviate the possibility of captured and compressed air, the blind via 804 can have shapes, such as hexagons or triangles.

Figure 9:
FIG. 9 is a top view of a via construction on a leadframe lead, in an alternative embodiment of the present invention.

Referring now to FIG. 9, therein is shown a top view of a via construction on a leadframe lead 900, in an alternative embodiment of the present invention. The top view depicts an alternative via 902, such as a rectangular via, formed in the leadframe lead 900. The alternative via 902 is formed by a process, such as punching, stamping or laser cutting. The alternative via 902 may have additional plating as required to meet the dimensional specifications. The rectangular shape of the alternative via 902 is for example and the shape may also be hexagonal, triangle or some other geometric shape.

Figure 10:
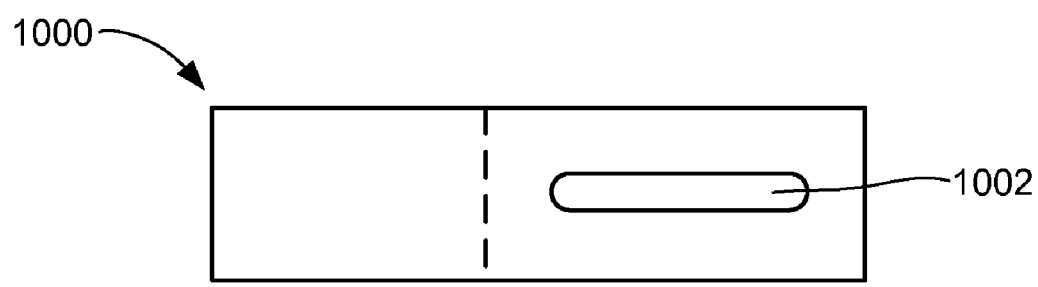
FIG. 10 is a top view of a via construction on a leadframe lead, in another alternative embodiment of the present invention.

Referring now to FIG. 10, therein is shown a top view of a via construction on a leadframe lead 1000, in another alternative embodiment of the present invention. The top view depicts a longitudinally elongated via 1002 on the leadframe lead 1000. The longitudinally elongated via 1002 is a preferred embodiment that allows for manufacturing tolerance in the position of a mating stud bump (not shown). The longitudinally elongated via 1002 is formed by a process, such as punching, stamping or laser cutting. The longitudinally elongated via 1002 may have additional plating as required to meet the dimensional specifications.

Figure 11:
FIG. 11 is a top view of a via construction on a leadframe lead, in yet another alternative embodiment of the present invention.

Referring now to FIG. 11, therein is shown a top view of a via construction on a leadframe lead 1100, in yet another alternative embodiment of the present invention. The top view depicts a transverse elongated via 1102 on the leadframe lead 1100. The transverse elongated via 1102 is a preferred embodiment that allows for manufacturing tolerance in the position of a mating stud bump (not shown). The transverse elongated via 1102 is formed by a process, such as punching, stamping or laser cutting. The transverse elongated via 1102 may have additional plating as required to meet the dimensional specifications.

Figure 12:
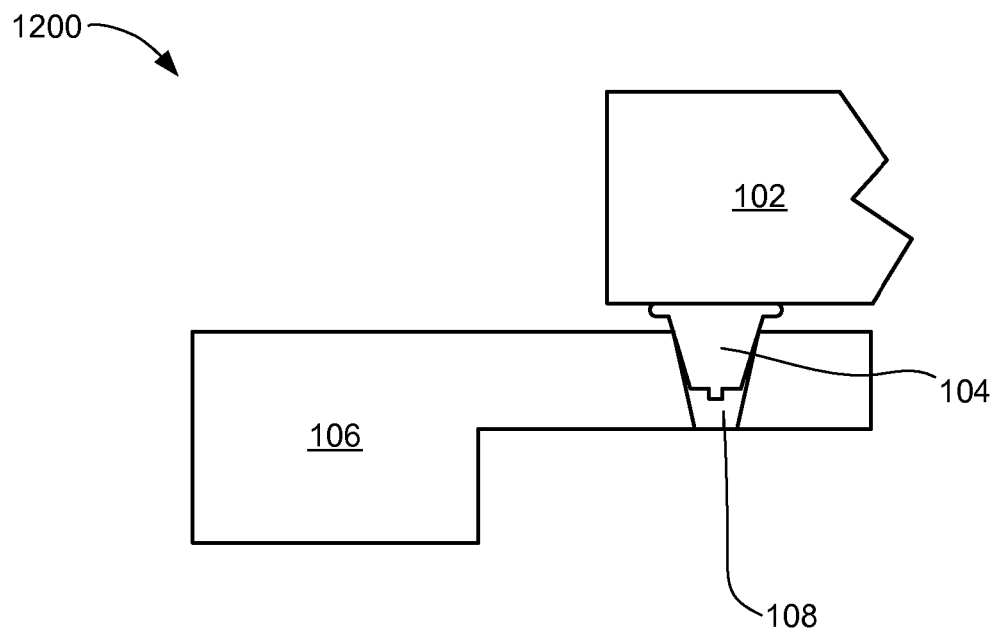
FIG. 12 is a more detailed cross-sectional view of the interface of the stud bump to the first structure, in an embodiment of the present invention.

Referring now to FIG. 12, therein is shown a more detailed cross-sectional view of the interface of the stud bump 104 to the first structure 106, in an embodiment of the present invention. The more detailed cross-sectional view depicts the second structure 102 having the stud bump 104 attached thereon. The stud bump 104 is positioned within the compression via 108 of the first structure 106, in preparation for the downward pressure that will form a mechanical bond between the compression via 108 and the stud bump 104.

Figure 13:
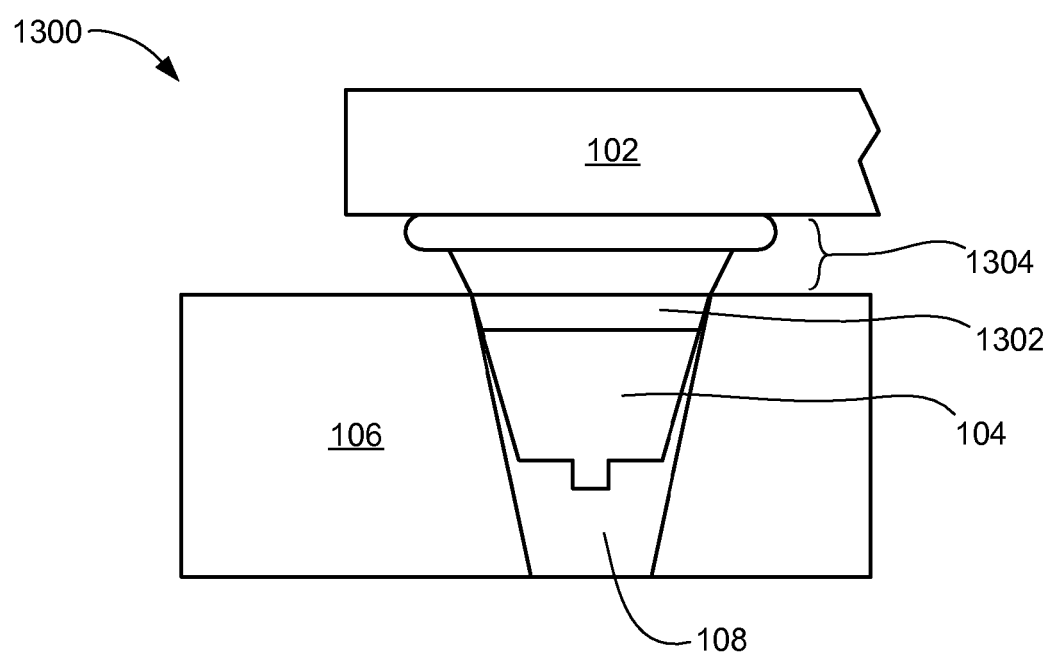
FIG. 13 is a further detailed cross-sectional view of the interface of the stud bump to the first structure of FIG. 1.

Referring now to FIG. 13, therein is shown a further detailed cross-sectional view of the interface of the stud bump 104 to the first structure 106 of FIG. 1. The further detailed cross-sectional view of the interface depicts the second structure 102 having the stud bump 104 attached thereon. A metal deformation region 1302 is depicted at the surface of the first structure 106 where the diameter of the stud bump 104 exceeds the diameter of the compression via 108. The design of the stud bump 104 relative to the opening of the compression via 108 determines a stand-off height 1304. The height can be precisely placed based on the position where the diameter of the stud bump 104 exceeds the diameter of the compression via 108. This aspect is important in the encapsulation phase of manufacture, as it allows molding compound to flow between the second structure 102 and the first structure 106. In some applications the stand-off height 1304 may be set to zero.

The use of the compression via 108 is for example, as the shape of the via may be different. A curved via may have sidewalls that are parabolic in curvature or a cylindrical via may have vertical side walls that have an outward flair at the top. Each of these shapes meet the criteria for an interference fit and will form the metal deformation region 1302 when the stud bump 104 is pressured into the opening of the selected via.

Figure 14:
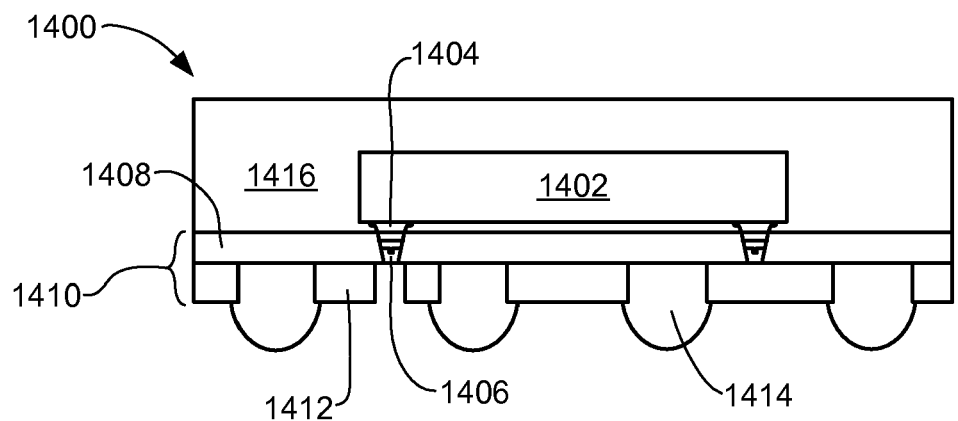
FIG. 14 is a cross-sectional view of the integrated circuit package system, in an alternative embodiment of the present invention.

Referring now to FIG. 14, therein is shown a cross-section of an integrated circuit package system 1400, in an alternative embodiment of the current invention. The cross-sectional view depicts an integrated circuit die 1402 having a stud bump 1404, such as gold wire based stud bumps, pressure mounted in a via 1406. The via 1406 is formed in a conductive layer 1408, such as a copper layer, of a tape substrate 1410. The tape substrate 1410 is formed of the conductive layer 1408 adhered to a support layer 1412, such as polyimide. The via 1406 is formed in the conductive layer 1408, system interconnects 1414, such as solder balls are adhered to the bottom of the conductive layer 1408. The top of the conductive layer 1408 and the integrated circuit die 1402 are encapsulated in a molding compound 1416.

Figure 15:
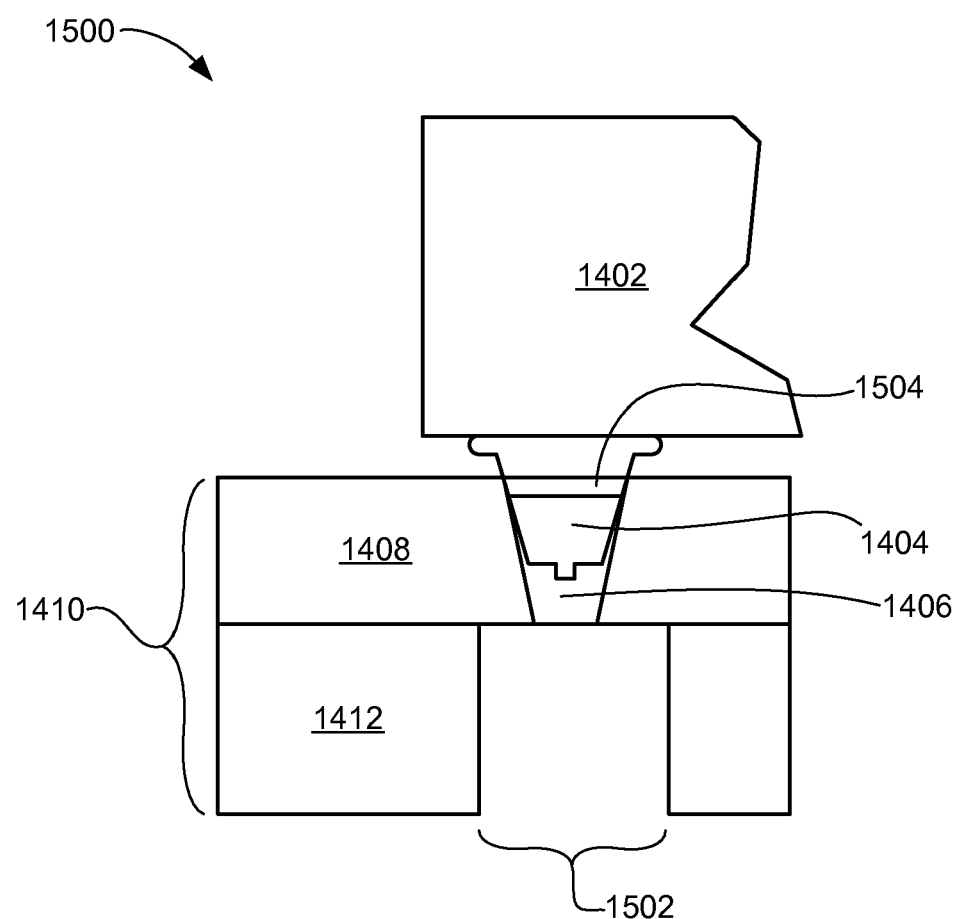
FIG. 15 is a more detailed cross-sectional view of an interface of the stud bump to a tape substrate, in another alternative embodiment of the present invention.

Referring now to FIG. 15, therein is shown a more detailed cross-sectional view of an interface 1500 of the stud bump 1404 to the tape substrate 1410, in another alternative embodiment of the present invention. The more detailed cross-sectional view depicts a magnified section of the interface 1500 of the stud bump 1404 to the tape substrate 1410. The support layer 1412 must be removed in a pressure support gap 1502. A support beam (not shown) is inserted in the pressure support gap 1502 for the pressure bonding of the stud bump 1404 to the via 1406 in the conductive layer 1408. The pressure bonding occurs when the stud bump 1404 is forced into the smaller opening in the via 1406, creating a metal deformation region 1504. The pressure bonding process is equivalent to thermo-compression bonding or thermo-sonic bonding, but requires less apparatus. After the encapsulation process, the pressure support gap 1502 is filled in with a section of the support layer 1412.

Figure 16:
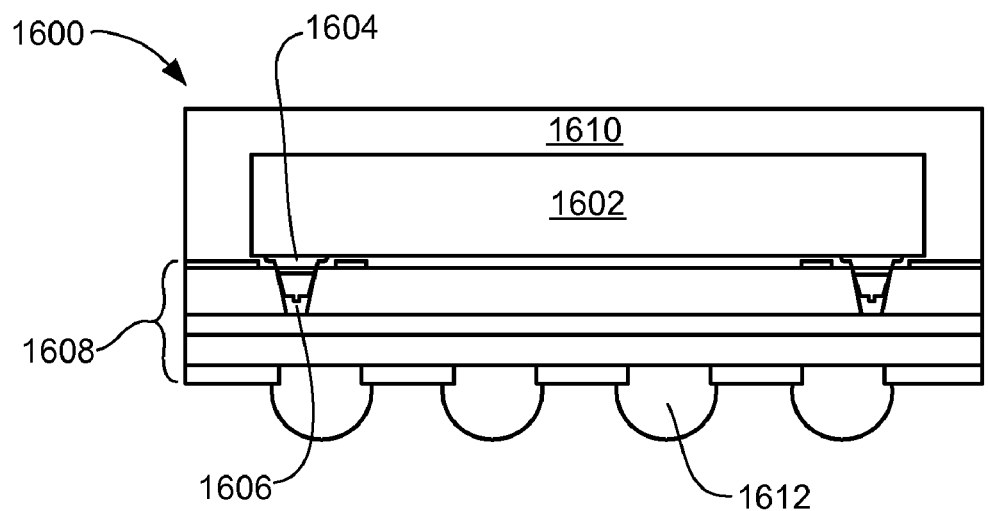
FIG. 16 is a cross-sectional view of the integrated circuit package system, in yet another alternative embodiment of the present invention.

Referring now to FIG. 16, therein is shown a cross-sectional view of an integrated circuit package system 1600, in yet another alternative embodiment of the present invention. The cross-sectional view depicts an integrated circuit die 1602, having a stud bump 1604, aligned and pressed into a via 1606, such as a compression via, on a laminate substrate 1608. The top of the laminate substrate 1608 and the integrated circuit die 1602 are encapsulated in a molding compound 1610. System interconnects 1612, such as solder balls, are attached to the bottom of the laminate substrate 1608 for attachment to the next level system (not shown).

Figure 17:
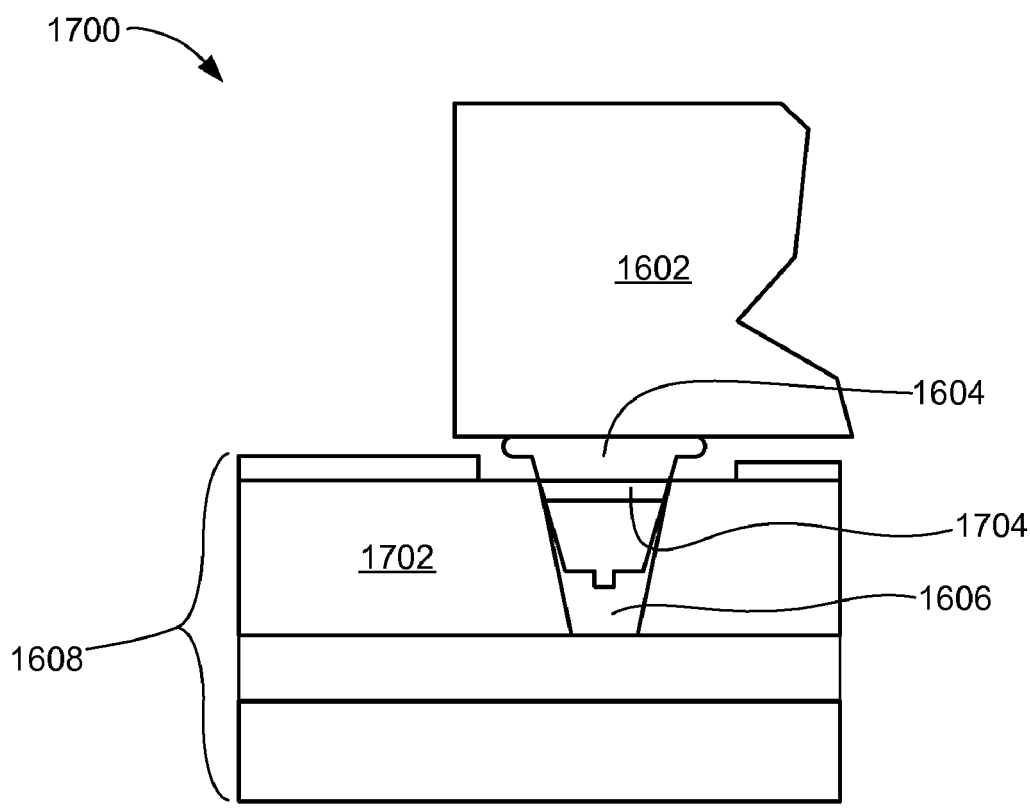
FIG. 17 is a more detailed cross-sectional view of an interface between the stud bump and the laminate substrate, in an embodiment of the present invention.

Referring now to FIG. 17, therein is shown a more detailed cross-sectional view of an interface 1700 between the stud bump 1604 and the laminate substrate 1608, in an embodiment of the present invention. The more detailed cross-sectional view depicts a magnified section of the interface 1700 of the stud bump 1604 to the laminate substrate 1608. The integrated circuit die 1602 has the stud bump 1604 attached to the active side. The stud bump 1604 is aligned with and pressed into the via 1606 that is formed in a signal layer 1702 of the laminate substrate 1608. The pressure used in forcing a larger diameter of the stud bump 1604 into the smaller diameter of the via 1606 causes a mechanical bond in a metal deformation region 1704. The position of the metal deformation region 1704 is determined by the slope of the stud bump 1604 and the slope of the via 1606. The area of the metal deformation region 1704 is also determined by the contact surfaces that form the edges of the via 1606.

Figure 18:
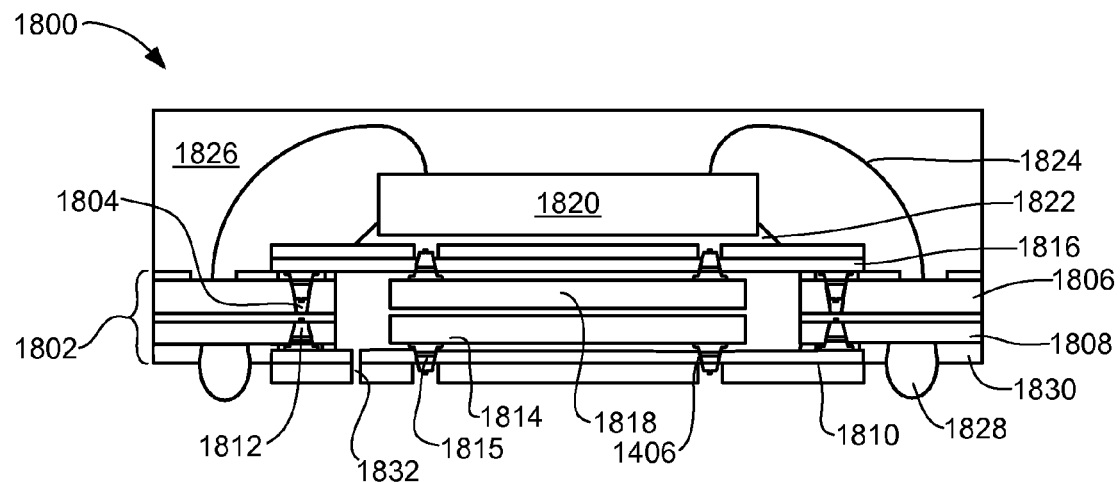
FIG. 18 is a cross-sectional view of a multi-chip package, in an alternative embodiment of the present invention.

Referring now to FIG. 18, therein is shown a cross-sectional view of a multi-chip package 1800, in an alternative embodiment of the present invention. The cross-sectional view depicts a third structure 1802, such as a laminate substrate, having a further compression via 1804 in a top signal layer 1806 and a bottom signal layer 1808. The figure depicts only two signal layers for simplicity though it is understood that any number of signal layers is possible.

A bottom first structure 1810, such as a tape substrate, is mounted to the bottom signal layer 1808 by pressure mounting of second stud bumps 1812 into the compression via 1804 forming a mechanical bond. The mechanical bond between the bottom signal layer 1808 and the bottom first structure 1810 also forms an electrical connection. A bottom second structure 1814, such as an integrated circuit die, is mounted on the bottom first structure 1810. The bottom second structure 1814 has the stud bumps 1815 that are pressure mounted into the via 1406 on the bottom first structure 1810 forming a mechanical bond. The mechanical bond between the bottom second structure 1814 and the bottom first structure 1810 also forms an electrical connection.

A top first structure 1816, such as the tape substrate, is mounted to the top signal layer 1806 by pressure mounting of the second stud bumps 1812 into the further compression via 1804 forming a mechanical bond. The mechanical bond between the top signal layer 1806 and the top first structure 1816 also forms an electrical connection. A top second structure 1818, such as the integrated circuit die, is mounted on the top first structure 1816. The top second structure 1818 has the stud bumps 1815 that are pressure mounted into the via 1406 on the top first structure 1816 forming a mechanical bond. The mechanical bond between the top second structure 1818 and the top first structure 1816 also forms an electrical connection.

A first wire bond integrated circuit die 1820 is attached to the bottom of the top first structure 1816 by a die attach material 1822. The first wire bond integrated circuit die 1820 is electrically connected to the top signal layer 1806 by bond wires 1824. The top of the third structure 1802, the first wire bond integrated circuit die 1820, the bottom of the top first structure 1816 and the bond wires 1824 are encapsulated by a molding compound 1826. System interconnects 1828 are attached to the bottom signal layer 1808, with a dielectric layer 1830 adhered around the system interconnects 1828. A vent opening 1832 is optionally cut in the bottom first structure 1810.

Figure 19:
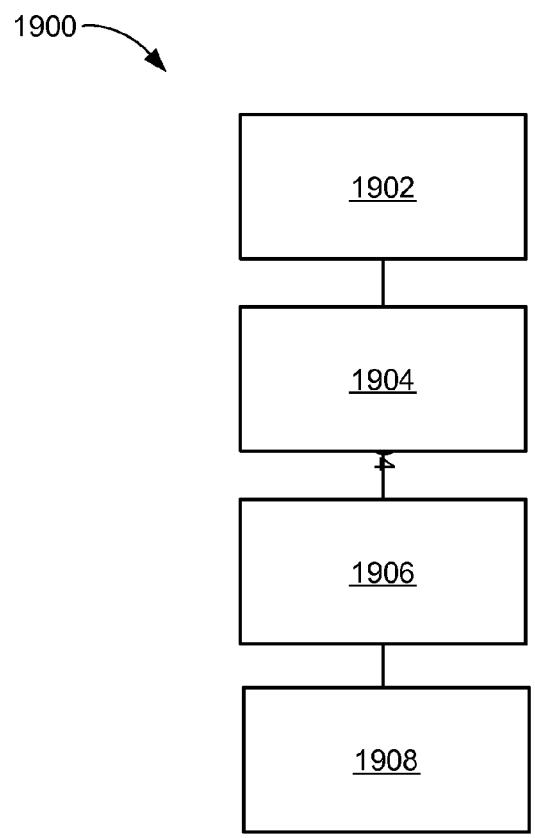
FIG. 19 is a flow chart of an integrated circuit package system for the manufacture of the integrated circuit package system, in an embodiment of the present invention.

Referring now to FIG. 19, therein is shown a flow chart of an integrated circuit package system 1900 for manufacturing the integrated circuit package system 100, in an embodiment of the present invention. The system 1900 includes providing a first structure in a block 1902; forming a compression via in the first structure in a block 1904; forming a stud bump on a second structure in a block 1906; and pressing the stud bump into the compression via forming a mechanical bond in a block 1908.

In greater detail, a method to manufacture an integrated circuit package system in an embodiment of the present invention, is performed as follows:
1. Providing a first structure. (FIG. 1)
2. Forming a compression via in the first structure by etching a diameter of the compression via. (FIG. 1)
3. Forming a stud bump on a second structure further comprises forming a conical shape. (FIG. 1) and
4. Forming a mechanical bond by pressing the stud bump into the compression via comprises forming a metal deformation region in the stud bump. (FIG. 13)

It has been discovered that the present invention thus has numerous aspects.

An aspect of the present invention is that, the mechanical bonding process enables assembly of an integrated circuit package without the use of lead (Pb) or solder flux. This process can be compatible with no-flow fluxing underfill (NFU) if necessary.

An aspect of the present invention is that the wafers don't require plated or printed bumps during fabrication. Bump studs are added later, using well known technology.

Another aspect of the present invention is that by using a mechanical bonding process, no reflow is necessary. This allows the integrated circuit die to go through the assembly process without being exposed to excessive heat. This is an aspect that is important to heat sensitive die, such as MEMs. A die can be attached to a leadframe or substrate without subjecting the die to high reflow temperatures.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system method and apparatus of the present invention furnish important and heretofore unknown and unavailable solutions, capabilities, and functional aspects for integrated circuit package assembly without the use of high temperatures or polluting chemicals. The resulting processes and configurations are straightforward, cost-effective, uncomplicated, highly versatile and effective, can be implemented by adapting known technologies, and are thus readily suited for efficiently and economically manufacturing integrated circuit devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method of making an integrated circuit package system comprising:
   providing a first structure;
   forming a compression via in the first structure;
   forming a stud bump on a second structure; and
   pressing the stud bump into the compression via forming a mechanical bond.

2. The method as claimed in claim 1 further comprising adjusting a stand-off height between the first structure and the second structure.

3. The method as claimed in claim 1 wherein forming the via forms an elongated via.

4. The method as claimed in claim 1 wherein providing the first structure provides a leadframe lead and providing the second structure provides an integrated circuit die.

5. The method as claimed in claim 1 further comprising:
   forming a second stud bump on the first structure;
   forming a third structure having a further compression via; and wherein:
    mounting the first structure includes:
        mounting the first structure on the third structure, and
        pressing the second stud bump into the further compression via to form a mechanical bond;
    providing the first structure provides a tape substrate;
    providing the second structure provides an integrated circuit die; and
    providing the third structure provides a laminate substrate.

6. A method of making an integrated circuit package system comprising:
    providing a first structure;
    forming a compression via in the first structure by etching a diameter of the compression via;
    forming a stud bump on a second structure further comprises forming a conical shape; and
    forming a mechanical bond by pressing the stud bump into the compression via, forming a metal deformation region in the stud bump.

7. The method as claimed in claim 6 further comprising adjusting a stand-off height between the first structure and the second structure comprising setting a distance, from the second structure, where the diameter of the stud bump exceeds the diameter of the compression via.

8. The method as claimed in claim 6 wherein forming the via comprises forming an elongated via by punching, stamping, laser cutting, or a combination thereof.

9. The method as claimed in claim 6 wherein providing the first structure provides a leadframe lead and providing the second structure provides an integrated circuit.

10. The method as claimed in claim 6 further comprising:
    forming a second stud bump on a conductive layer of the first structure;
    forming a third structure including etching a further compression via in a signal layer of the third structure comprises forming the further compression via therein; and
wherein:
    mounting the first structure includes:
        mounting the first structure on the third structure, and
        pressing the second stud bump into the further compression via to form a mechanical bond;
    providing the first structure provides a tape substrate;
    providing the second structure provides an integrated circuit die; and
    providing the third structure provides a laminate substrate.

11. An integrated circuit package system comprising:
    a first structure;
    a compression via formed in the first structure;
    a stud bump formed on an second structure; and
    a mechanical bond formed by the stud bump having an interference fit with the compression via.

12. The system as claimed in claim 11 further comprising a stand-off height between the first structure and the second structure.

13. The system as claimed in claim 11 wherein the via forms an elongated via.

14. The system as claimed in claim 11 wherein the first structure provides a leadframe lead and the second structure provides an integrated circuit die.

15. The system as claimed in claim 11 further comprises:
    a second stud bump formed on the first structure;
    a signal layer, in a third structure, having a further compression via formed therein; and
wherein:
    the first structure mounted includes:
        the first structure mounted on the third structure, and
        a mechanical bond formed by the second stud bump having an interference fit with the further compression via;
    the first structure provides a tape substrate;
    the second structure provides an integrated circuit die; and
    the third structure provides a laminate substrate.

16. The system as claimed in claim 11 wherein:
    an etched dimension in the via;
    a conical shape forms the stud bump; and
    a metal deformation region in the stud bump comprises the mechanical bond.

17. The system as claimed in claim 16 further comprising a stand-off height between the first structure and the second structure, a distance, from the second structure, based on where the diameter of the stud bump exceeds the diameter of the via.

18. The system as claimed in claim 16 wherein the via comprises an elongated via.

19. The system as claimed in claim 16 wherein the first structure provides a leadframe lead, having an inner lead that is half etched and the second structure provides an integrated circuit die.

20. The system as claimed in claim 16 further comprising:
    a conductive layer in the first structure with a second stud bump, having a conical shape, formed thereon;
    a signal layer, of a third structure, having the further compression via therein; and
wherein:
    the first structure mounted includes:
        the first structure mounted on the third structure,
        a mechanical bond formed by the second stud bump having an interference fit with the further compression via, the metal deformation region in the second stud bump;
    the first structure provides a tape substrate;
    the second structure provides an integrated circuit die; and
    the third structure provides a laminate substrate.

\* \* \* \* \*